United States Patent [19]

Fujihira et al.

[11] Patent Number: 5,306,669
[45] Date of Patent: Apr. 26, 1994

[54] INTEGRATED CIRCUIT DEVICE AND METHOD FOR MANUFACTURING THE SAME

[75] Inventors: Mitsuaki Fujihira; Yoshiaki Tanaka, both of Yokohama, Japan

[73] Assignee: Sumitomo Electric Industries, Ltd., Osaka, Japan

[21] Appl. No.: 8,302

[22] Filed: Jan. 25, 1993

Related U.S. Application Data

[60] Division of Ser. No. 794,669, Nov. 18, 1991, Pat. No. 5,196,918, which is a continuation of Ser. No. 566,504, Aug. 13, 1990, abandoned.

[30] Foreign Application Priority Data

Aug. 28, 1989 [JP] Japan .................................. 1-220848

[51] Int. Cl.$^5$ ................................................ H01L 21/60
[52] U.S. Cl. .................................. 437/209; 437/211; 437/214; 437/217; 437/220; 148/DIG. 158
[58] Field of Search ............... 437/209, 211, 217, 220, 437/214; 148/DIG. 158

[56] References Cited

U.S. PATENT DOCUMENTS

| | | | |
|---|---|---|---|
| 3,747,202 | 7/1973 | Jordan | 357/72 |
| 3,908,184 | 9/1975 | Anazawa et al. | 357/72 |
| 4,300,153 | 11/1981 | Hayakawa et al. | 357/72 |
| 4,579,609 | 4/1986 | Reif et al. | 148/DIG. 158 |
| 4,735,662 | 4/1988 | Szabo et al. | 357/71 R |
| 4,933,304 | 6/1990 | Chen et al. | 148/DIG. 158 |
| 5,016,089 | 5/1991 | Fujii et al. | 357/71 |
| 5,047,776 | 9/1991 | Demmin et al. | 357/71 |

FOREIGN PATENT DOCUMENTS

| | | | |
|---|---|---|---|
| 0079211 | 5/1983 | European Pat. Off. | |
| 52-129375 | 10/1977 | Japan . | |
| 0114363 | 9/1981 | Japan | 357/72 |

*Primary Examiner*—Brian E. Hearn
*Assistant Examiner*—Kevin M. Picardat
*Attorney, Agent, or Firm*—Stevens, Davis, Miller & Mosher

[57] ABSTRACT

An integrated circuit device having an electronic circuit component connected by wire-bonding is characterized in that a masking member having a lower sputtering rate than that of the material forming the electrodes to be used for the wire-bonding is arranged around the electronic circuit component. A method for manufacturing an integrated circuit device having an electronic circuit component connected by wire-bonding is characterized in that a masking member having a lower sputtering rate than that of the material forming the electrodes to be used for the wire-bonding is arranged around the electronic circuit component.

13 Claims, 5 Drawing Sheets

INTEGRATED CIRCUIT DEVICE AND METHOD FOR MANUFACTURING THE SAME

This is a division of application Ser. No. 07/794,669 filed Nov. 18, 1991 now U.S. Pat. No. 5,196,918 which was a continuation of application Ser. No. 07/566,504 filed Aug. 13, 1990 (abandoned).

BACKGROUND OF THE INVENTION

1. Field of the Invention

The present invention relates to an integrated circuit device having an electronic circuit component connected by wire-bonding and a method for manufacturing the device.

2. Related Background Art

In a prior art integrated circuit, as shown in FIG. 1, a conductive pattern 2 is printed on a substrate 1, and electronic circuit components such as a parallel-plate capacitor 3 and an IC Chip 4 are connected on the conductive pattern 2. Such parallel-plate capacitor 3 and IC Chip 4 are connected to each other by wire-bonding either directly or through the conductive pattern 2. When those electronic circuit components are to be connected on the conductive pattern 2, resin bonding material primarily consisting illustrating epoxy or polyimide, solder or brazing material such as Au-Si or Au-Sn is used.

However, where the resin bonding material is used, electrodes are contaminated by organic material when the resin is heated and cured. Where the solder is used, the electrodes are contaminated by flux, and where the brazing material such as Au-Si is used, the surfaces of the electrodes are modified or oxide films are formed thereon because of a heating process at 300° to 450° C. Thus, none of the above processes attains a sufficiently high wire-bonding strength. Accordingly, prior to the wire-bonding, cleaning is done by ionized gas to remove foreign materials on the surfaces of the electrodes. A typical example of the cleaning process is a sputter cleaning process (sputter etching process) which uses Ar ions.

FIG. 2 shows an enlarged diagram illustratins a prior art sputter cleaning process for an integrated circuit device. In this process, atoms (shown by circles) which form the conductive pattern 2 which has been sputter-etched by Ar ions (shown by dots) redeposit on side walls of the parallel-plate capacitor 3 to short-circuit the electrodes 3a and 3b.

Where the IC Chip is mounted, the atoms which form the conductive pattern redeposit on the IC Chip pattern to cause a malfunction.

SUMMARY OF THE INVENTION

It is an object of the present invention to prevent the redeposition of the sputter-etched atoms in order to improve yield and reliability in the manufacture of the integrated circuit device.

In order to achieve the above object, the integrated circuit having electronic circuit components connected by wire-bonding, in accordance with the present invention, is characterized in that masking materials consisting of atoms having a smaller sputtering rate than that of atoms which form the electrodes to be used for the wire-bonding (hereinafter referred to as wire-bonding electrodes) are arranged around the electronic circuit components.

The method for manufacturing the integrated circuit device having electronic circuit components connected by wire-bonding, in accordance with the present invention, is characterized in that the masking materials consisting of atoms having a smaller sputtering rate than that of the atoms which form the wire-bonding electrodes are arranged around the electronic circuit components.

The term "wire-bonding electrodes" used herein means connecting parts to which wires are connected when the wires are to be directly connected to the electronic circuit component or underlying material, such as electrodes of a parallel-plate capacitor or a conductive pattern.

In accordance with the present invention, it does not happen that the mask material is sputter-etched while the wire-bonding electrode is sputter-etched. Further, since the masking materials are arranged around the electronic circuit components, even if the underlying material (for example, conductive pattern) of the electronic circuit components is sputter-etched, the sputter-etched atoms do not reach to the electronic circuit components.

Accordingly, the yield and reliability in the manufacture of the integrated circuit device are significantly improved.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
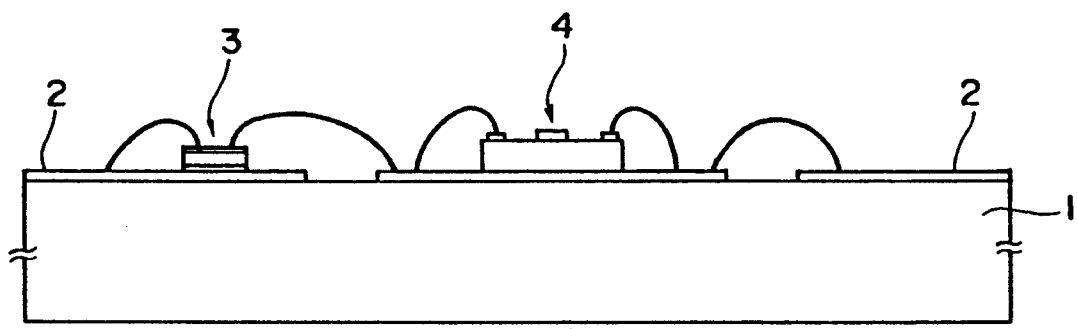
FIG. 1 shows a side view of a prior art hybrid integrated circuit device.
Figure 2:
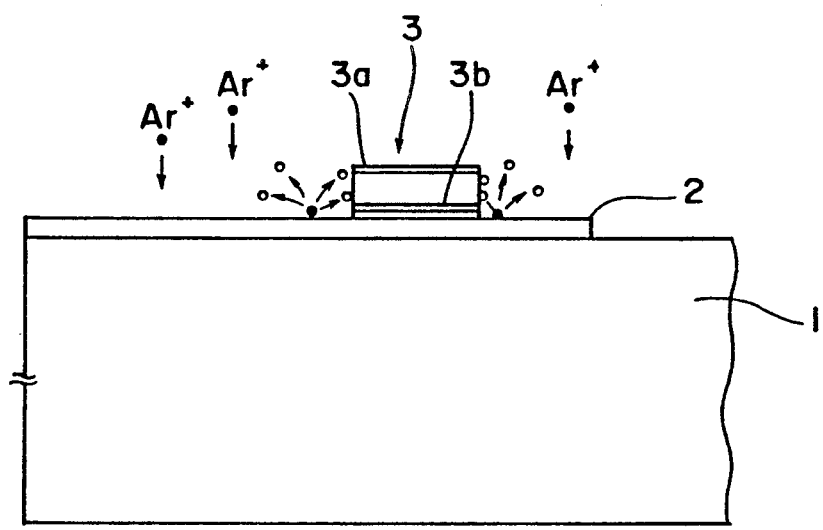
FIG. 2 shows an enlarged side view for illustrating a sputter cleaning process to a portion of the prior art hybrid integrated circuits device.
Figure 3:
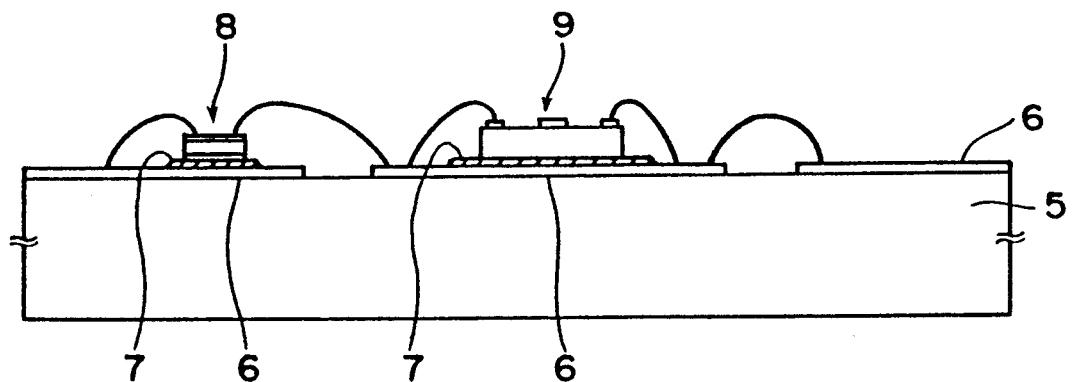
FIG. 3 shows a side view of one embodiment of a hybrid integrated circuits device of the present invention.

FIG. 3 shows a side view of a hybrid integrated circuit device in accordance with one embodiment of the present invention. A conductive pattern 6 is printed on a substrate 5. Electronic circuit components 8 and 9 such as a parallel-plate capacitor and an IC chip are connected through bonding materials (masking materials) 7 on the conductive pattern 6. A sputtering rate of the bonding material 7 is selected to be smaller than the sputtering rates of the conductive pattern 6 and the wire-bonding electrode of electronic circuit components 8 and 9. The conductive pattern 6 is made of atoms whose sputtering rate is higher than that of the wire-bonding electrode. It is important to note that the bonding materials 7 are applied to have a great width than the bottom areas of the electronic circuit components 8 and 9 and the materials (atoms) which form the bonding materials 7 have a lower sputtering rate than that of the material (atom) which forms the wire-bonding electrodes. The bonding materials 7 are arranged around the electronic circuit components 8 and 9 so that the bonding materials are prevented from being sputter-etched even if the wire-bonding electrodes are sputter-etched by a sputter cleaning method.

Figure 4:
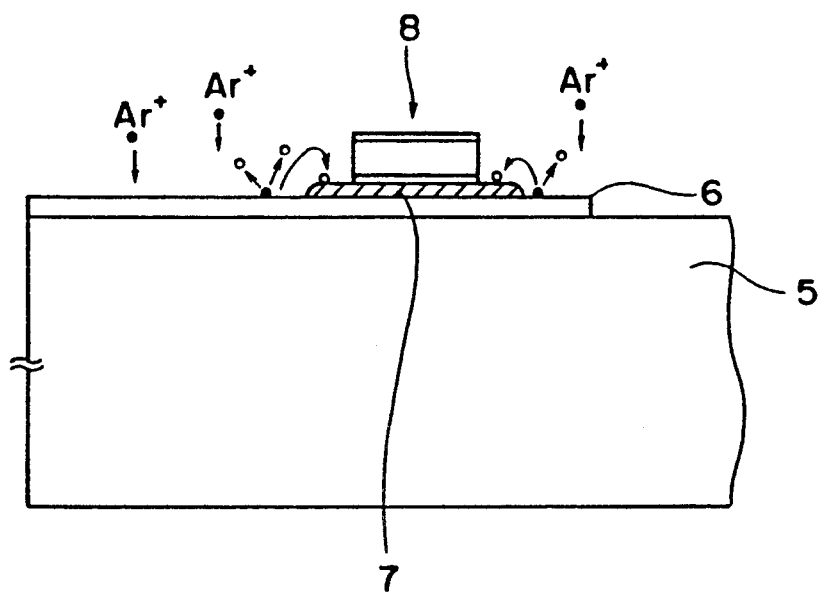
FIG. 4 shows an enlarged diagram for illustrating a sputter cleaning process to a portion of the hybrid integrated circuits device of the embodiment.

FIG. 4 shows an enlarged diagram illustrating the sputter cleaning process for a portion of the hybrid integrated circuits device of the present embodiment. In this process, the atoms (shown by circles) sputter-etched by the Ar ions (shown by dots) scatter around but the scattering atoms do not reach the electronic circuit components 8 because the bonding materials 7 which are formed by the atoms which are not sputter-etched by the sputter cleaning process are widely arranged around the electronic circuit components 8.

Figure 5:
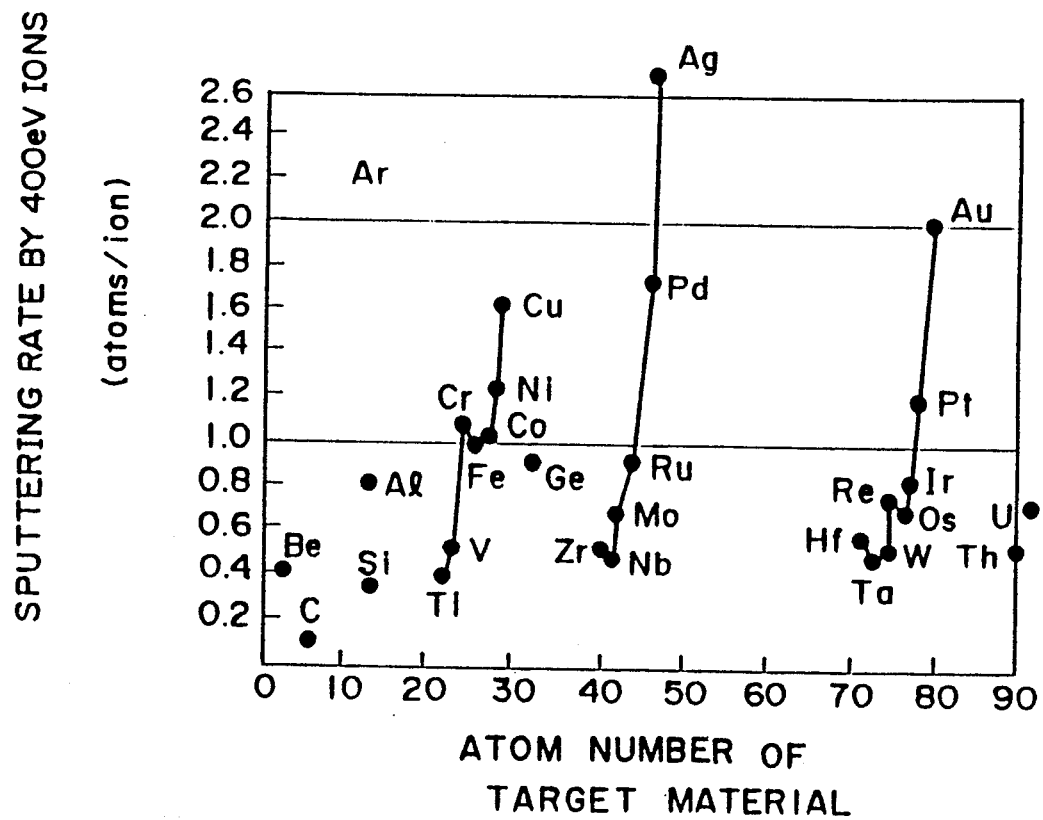
FIG. 5 shows sputtering rates by Ar ions for various atoms.

FIG. 5 shows sputtering rates by Ar ions for various atoms. For example, when Au is used as a material for the wire-bonding electrode, Si, Ge or Sn which has a lower sputtering rate may be used as masking materials. An alloy which includes those atoms may also be used as masking materials. For example, a conventional bonding material such as epoxy resin, Au-3.15Si, Au-12Ge, or Au-20Sn may be used as masking materials. As for Au-3.15Si, approximately 20 (atomic) % of the alloy consists of Si which has a one-order lower sputtering rate than that of Au, and oxide films such as $SiO_2$ are formed on a surface in the heat bonding process. Accordingly, the sputtering rate of Au-3.15Si becomes very much lower than that of Au. The same is true for Au-12Ge and Au-20Sn.

Where Ag-Pd is used as an underlying material for the wire-bonding electrode of Au, epoxy resin or Sn-36Pb-2Ag solder may be used as a material for a masking member. For example, when a combination of an electrode made of Ag-Pd and a masking material made of epoxy resin (Ag whose sputtering rate is higher than that of Pd forming the electrode may be added thereto) is used, the sputtering rate of the epoxy resin is very much lower than that of Ag-Pd because a main component element of the epoxy resin is C (carbon) which has a very low sputtering rate and the amount of addition of Ag, if any, is small.

Figure 6:
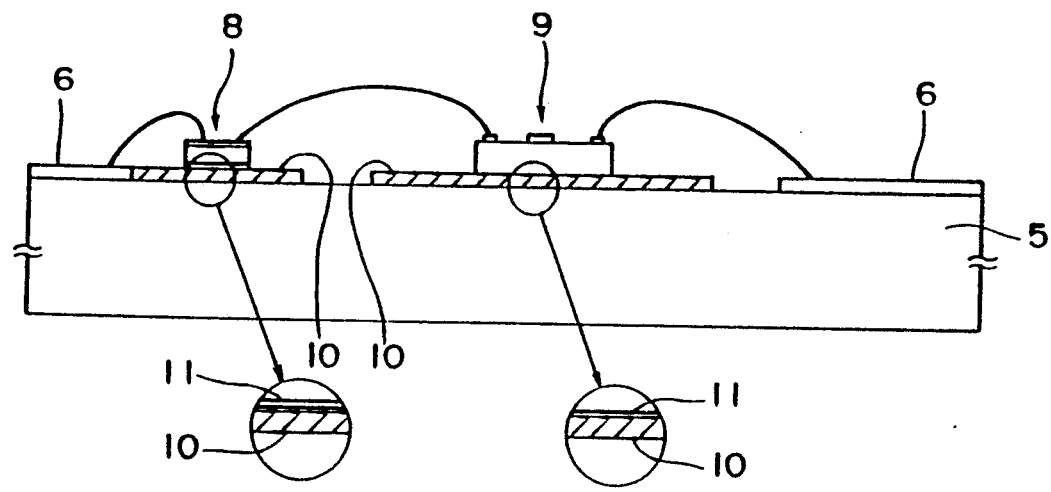
FIG. 6 shows a side view of another embodiment of the hybrid integrated circuits device of the present invention.

FIG. 6 shows a sectional view of another embodiment of the hybrid integrated circuit device of the present invention. A difference from the above embodiment lies in the use of the conductive pattern 10 as the masking material. Conductive patterns 6 and 10 are printed on a substrate 5. A sputtering rate of the material (atom) which forms the conductive pattern 10 is selected to be lower than the sputtering rate of the material (atom) which forms the conductive pattern 6. Further, the conductive pattern 10 is wider than the bottom area of the electronic circuit component and the material (atom) thereof has a lower sputtering rate than the material (atom) which forms the wire-bonding electrodes. The masking materials (conductive patterns 10) are arranged around the electronic circuit components 8 and 9. As shown in the enlarged view, the electronic circuit components 8 and 9 are fixed on the conductive pattern 10 by the bonding material 11.

Figure 7:
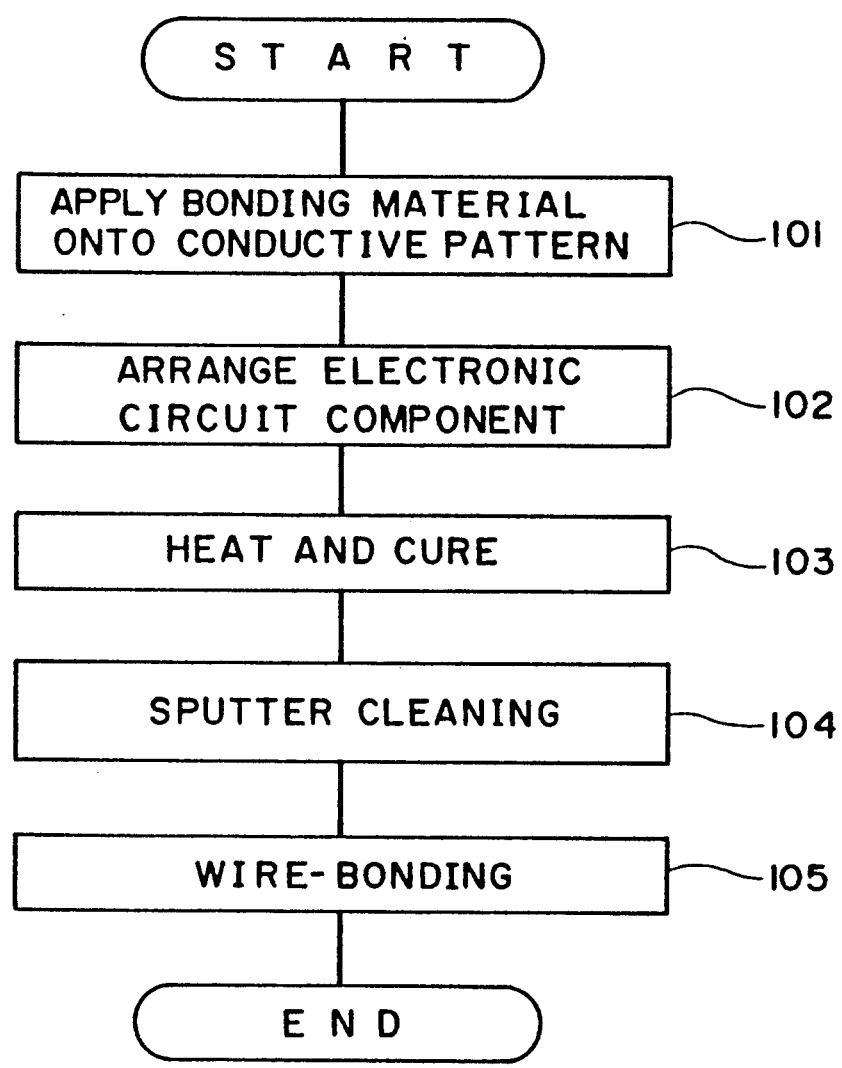
FIG. 7 shows a process chart of one embodiment of a method for manufacturing a hybrid integrated circuits device of the present invention.

Referring to FIG. 3, a method for manufacturing the integrated circuit device in accordance with an embodiment of the present invention is now explained with reference to FIG. 7. FIG. 7 shows a process of the method for manufacturing the hybrid integrated circuits device in accordance with the present embodiment. The bonding material 7 is applied onto the conductive pattern 6 printed on the substrate 5 (step 101). The electronic circuit components 8 and 9 having wire-bonding electrodes are arranged near the center of the bonding material 7 (step 102). The electrode is made of a material (atom) whose sputtering rate is higher than that of the bonding material 7 and is lower than that of the conductive pattern 6. Further, the bonding material 7 is coated wider than the bottom area of the electronic circuit components 8 and 9. The bonding material 7 is then heated and cured (step 103) and the electronic circuit components 8 and 9 are connected to the substrate 5. In the heat and curing process, contamination by organic materials occurs in the electronic circuit components 8 and 9 such as, a capacitor and an IC Chip and the wire-bonding electrodes of the conductive pattern 6. Accordingly, the substrate 5 is cleaned by the sputter cleaning method by the Ar ions (step 104). Since the material (atom) which forms the bonding material 7 has a lower sputtering rate than that of the atoms which form the wire-bonding electrodes and the contaminated layer is as thin as only several tens of angstroms, the contaminated layers on the wire-bonding electrodes are easily removed and the bonding materials 7 are not essentially sputter-etched even if the surfaces of the electrode materials are sputter-etched.

Further, since the bonding materials 7 are widely arranged around the electronic circuit components 8 and 9, even if the conductive pattern 6 is sputter etched, the sputter-etched atoms thereof do not reach to the electronic circuit components 8 and 9. Through the cleaning process, new clean surfaces are exposed on the surfaces of the wire-bonding electrodes. Since the wire-bonding is done to the new surfaces (step 105), the wire-bonding strength is remarkably improved.

Figure 8A:
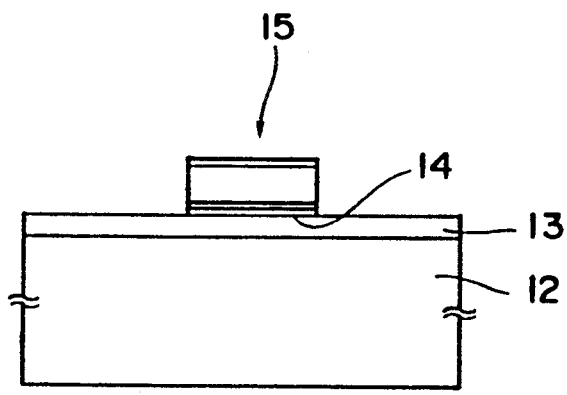
FIGS. 8A and 8B show side views of the device of the present invention and a prior art device.
Figure 8B:
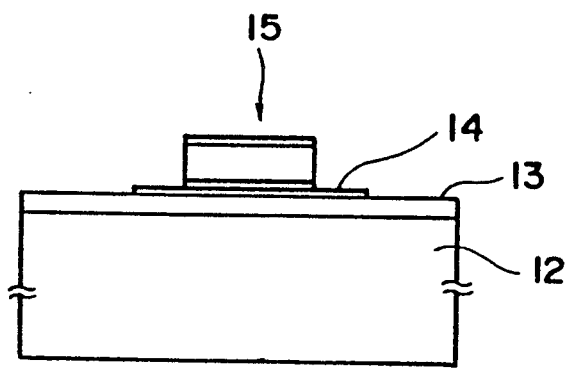

Finally, an experiment to compare the presence or absence of a short-circuit in a parallel-plate capacitor for the integrated circuit device of the present invention and a prior art integrated circuit device is explained. FIGS. 8A and 8B show devices used in the experiment. FIG. 8A shows the prior art device and FIG. 8B shows the device of the present invention. Both devices have Au conductive patterns 13 printed on the substrate 12, and the parallel-plate capacitors 15 having a thickness of 100 μm are connected to the conductive patterns 13 through Au-20Sn bonding materials 14. In the device of the present invention, the bonding material 14 is applied wider than the bottom area of the parallel-plate capacitor 15 so that it extends externally of the parallel-plate capacitor 15 by approximately 100 μm. Those devices were sputter-etched by the Ar ions for three minutes by 100 W RF power. For the prior art devices, 64 out of 100 devices exhibited a short-circuit. For the devices of the present invention, none out of 100 devices exhibited a short-circuit.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A method for manufacturing an integrated circuit device on a substrate, said device including an electronic circuit component connected to wires, said method comprising the steps of:
   providing a substrate;
   forming a bonding mask member on said substrate, said bonding mask member being formed of a material having a first sputtering rate;
   providing an electronic circuit component on said bonding mask member;
   forming electrodes on a surface of said electronic circuit component, said electrodes being made of a material having a higher sputtering rate than said first sputtering rate;
   performing a sputter cleaning process to pre-clean said electrodes; and
   connecting wires to said electrodes of said electronic circuit component.

2. A method for manufacturing an integrated circuit device on a substrate, said device including an electronic circuit component connected to wires, said method comprising the steps of:
   providing a substrate;
   forming an underlying member on said substrate, said underlying member being formed of a material having a first sputtering rate;
   forming a bonding mask member on said underlying member, said bonding mask member being formed of a material having a second sputtering rate which is lower than said first sputtering rate;
   providing an electronic circuit component on said bonding mask member;
   forming electrodes on a surface of said electronic circuit component, said electrodes being made of a material having a lower sputtering rate than said first sputtering rate and having a higher sputtering rate than said second sputtering rate;
   performing a sputter cleaning process to pre-clean said electrodes; and
   connecting wires to said electrodes of said electronic circuit component.

3. A method as in claim 2, wherein a bottom surface area of said electronic circuit component is smaller than (i) an upper surface area of said underlying member and (ii) an upper surface area of said bonding mask member.

4. A method of manufacturing an integrated circuit device, comprising:
   providing a substrate;
   forming an underlying member on said substrate;
   forming a bonding mask member on said underlying member;
   providing an electronic circuit component on said bonding mask member, wherein said underlying member extends over an area greater than a bottom surface area of said electronic circuit component;
   forming electrodes on a surface of said electronic circuit component, said electrodes being made of a material having a lower sputtering rate than a sputtering rate of a material of which said underlying member is formed;
   performing a sputter cleaning method to pre-clean said substrate and to pre-clean said electrodes, prior to having wires connected to said electrodes; and
   connecting wires to said electrodes;
   wherein said bonding mask member (i) is made of a material having a lower sputtering rate than said sputtering rate of said electrodes and (ii) is formed to extend over an area sufficiently greater than said bottom surface area of said electronic circuit component to prevent atoms which scatter from said underlying member from reaching said electrodes while said electrodes are being pre-cleaned by said sputter cleaning method prior to said wires being connected thereto, and
   said underlying member is formed to comprise a conductive pattern having a contact portion which is connected to one end of said wires.

5. A method as in claim 4, wherein said bonding mask member is formed to extend beyond said bottom surface area of said electronic circuit component by approximately 100 microns.

6. A method as in claim 4, wherein said electronic circuit component is disposed above a bonding area of said substrate.

7. A method as in claim 6, wherein said contact portion of said conductive pattern is formed to have a higher sputtering rate than said sputtering rate of said material forming said electrodes.

8. A method as in claim 6, wherein said bonding area is spaced apart from said conductive pattern and said method further comprises connecting wires between said contact portion and said electrodes.

9. A method of manufacturing an integrated circuit device, comprising:
   providing a substrate;
   forming a first conductive pattern and a second conductive pattern on said substrate, said second conductive pattern being formed of a bonding mask material having a lower sputtering rate than a sputtering rate of a material forming said first conductive pattern;
   providing an electronic circuit component on said second conductive pattern;
   forming electrodes on a surface of said electronic circuit component, said electrodes being made of a material having a higher sputtering rate than said sputtering rate of said bonding mask material forming said second conductive pattern and a lower sputtering rate than said sputtering rate of said material forming said first conductive pattern;
   performing a sputter cleaning process on said electrodes prior to having wires connected to said electrodes; and
   connecting wires to said electrodes,
   wherein said second conductive pattern is formed to extend over an area sufficiently greater than a bottom surface area of said electronic circuit component to prevent atoms which scatter from said first conductive pattern from reaching said electrodes while said electrodes are being pre-cleaned by said sputter cleaning method prior to said wires being connected thereto.

10. A method as in claim 9, wherein said first conductive pattern is formed to have a contact portion to which one end of said wires are connected, and during said step of sputter cleaning said electrodes, said substrate is also pre-cleaned by said sputter cleaning process.

11. A method as in claim 9, wherein said second conductive pattern is formed to extend beyond said bottom surface area of said electronic circuit component by approximately 100 microns.

12. An integrated circuit device as in claim 9, wherein said substrate is formed to include a bonding area and said second conductive pattern is formed at said bonding area.

13. An integrated circuit device as in claim 10, wherein said contact portion of said first conductive pattern is formed of a material having a higher sputtering rate than said sputtering rate of said material forming said electrodes.

* * * * *